United States Patent
Eshima

(10) Patent No.: US 7,900,640 B2
(45) Date of Patent: Mar. 8, 2011

(54) CLEANING APPARATUS INCLUDING CLEANING TANK WITH IMPROVED COVER

(75) Inventor: Kazuyoshi Eshima, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 469 days.

(21) Appl. No.: 11/922,480

(22) PCT Filed: Jun. 28, 2006

(86) PCT No.: PCT/JP2006/312879
§ 371 (c)(1),
(2), (4) Date: Dec. 19, 2007

(87) PCT Pub. No.: WO2007/004485
PCT Pub. Date: Jan. 11, 2007

(65) Prior Publication Data
US 2009/0120466 A1    May 14, 2009

(30) Foreign Application Priority Data
Jun. 30, 2005    (JP) ................ 2005-192725

(51) Int. Cl.
*B08B 3/00* (2006.01)
(52) U.S. Cl. ........ 134/94.1; 134/186; 134/187; 134/188; 134/200
(58) Field of Classification Search ................ 134/56 R, 134/61, 94.1, 186, 200, 187, 188
See application file for complete search history.

(56) References Cited

U.S. PATENT DOCUMENTS

| | | | | |
|---|---|---|---|---|
| 5,701,542 A | * | 12/1997 | Sasayama | 396/578 |
| 5,826,601 A | * | 10/1998 | Muraoka et al. | 134/2 |
| 6,050,446 A | * | 4/2000 | Lei et al. | 220/819 |
| 2001/0004898 A1 | * | 6/2001 | Kamikawa et al. | 134/2 |
| 2005/0008360 A1 | | 1/2005 | Gomi | |

FOREIGN PATENT DOCUMENTS

| | | |
|---|---|---|
| JP | 4-97525 | 3/1992 |
| JP | 6-104234 | 4/1994 |
| JP | 10-289894 | 10/1998 |
| JP | 2000-031103 | 1/2000 |
| JP | 2001-338904 | 12/2001 |
| JP | 2004-358283 | 12/2004 |

OTHER PUBLICATIONS

Official Action Japanese Patent Application No. 2005-192725, mailed on Jun. 15, 2010 w/partial translation.

* cited by examiner

*Primary Examiner* — Michael Barr
*Assistant Examiner* — Saeed T Chaudhry
(74) *Attorney, Agent, or Firm* — Smith, Gambrell & Russell, LLP

(57) ABSTRACT

A cleaning apparatus includes a cleaning tank (2) which stores a process liquid used for cleaning a target object (W), a target object holding mechanism (4) which holds the target object (W) in the cleaning tank (2), and a process liquid supply mechanism (3) which supplies the process liquid to the cleaning tank (2). The target object (W) is immersed in the process liquid in the cleaning tank (2), and is cleaned while letting the process liquid overflow from the cleaning tank (2), thereby cleaning the target object (W). The cleaning apparatus further includes a cover (10) which covers a liquid surface in the cleaning tank (2), a support member (15a, 15b) which supports the cover (10), and a follow-up mechanism (14a, 14b) which moves the cover (10) such that the cover (10) follows the liquid surface while the cover (10) is supported by the support member (15a, 15b).

16 Claims, 14 Drawing Sheets

CLEANING APPARATUS INCLUDING CLEANING TANK WITH IMPROVED COVER

TECHNICAL FIELD

The present invention relates to a cleaning apparatus and a cleaning method for cleaning a target object by immersing it in a chemical liquid in a chemical tank which stores the chemical liquid for cleaning, and a computer readable storage medium for implementing the cleaning method.

BACKGROUND ART

For example, in a semiconductor device manufacturing process, devices such as transistors are formed on a semiconductor wafer (to be merely referred to as a wafer hereinafter) by various processes. If contaminants such as particles, organic contaminants, and/or metal impurities are present on the surface of the devices, it degrades the performance of the devices. Hence, the wafer must be cleaned for removing the contaminants. As such a wafer cleaning process, a process of storing a predetermined cleaning liquid in a cleaning tank and immersing a wafer in the cleaning liquid is employed often. This cleaning process is advantageous in that it can effectively remove the particles attached to the wafer.

The cleaning process using such a cleaning tank employs a cleaning apparatus in which a large number of chemical tanks for cleaning wafers in a batch manner using various types of chemical liquids, and a large number of purified water cleaning tanks are arranged alternately, thereby enabling a continuous batch process.

Demands for minimizing the space where the entire cleaning system is installed, decreasing the total cost, and the like arise recently, and a so-called one-path cleaning apparatus attracts attention (for example, see patent document 1). In a multi-tank cleaning apparatus as described above, chemical tanks and purified water cleaning tanks are arranged alternately to correspond to the respective processes. Unlike the multi-tank cleaning apparatus, the one-path cleaning apparatus has a function of supplying and discharging one or a plurality of chemical liquids and purified water to and from one cleaning tank, so that a plurality of processes are performed in the single tank. The one-path cleaning apparatus performs cleaning while supplying each chemical liquid into the chemical tank from a chemical liquid supply nozzle provided to the lower portion of the chemical tank and letting the chemical liquid overflow.

When performing the cleaning process in this manner, usually, the liquid surface is in contact with a gas in the tank. Hence, convection of the chemical liquid during the overflow undesirably dissolves the gas into the chemical liquid. When the gas dissolves into the chemical liquid in this manner, the cleaning process becomes less uniform. This problem is not limited in the one-path cleaning apparatus, but exists not a little in any cleaning apparatus that uses a cleaning tank.

Patent Document 1: Jpn. Pat. Appln. KOKAI Publication No. 10-289894

DISCLOSURE OF INVENTION

It is an object of the present invention to provide a cleaning apparatus and a cleaning method which can improve uniformity in the cleaning process by suppressing dissolution of a gas into a chemical liquid stored in a chemical tank.

It is another object of the present invention to provide a computer readable storage medium for implementing such a cleaning method.

According to a first aspect of the present invention, there is provided a cleaning apparatus comprising: a cleaning tank configured to store a process liquid used for cleaning a target object; a target object holding mechanism configured to hold the target object in the cleaning tank; and a process liquid supply mechanism configured to supply the process liquid to the cleaning tank, wherein the process liquid is supplied to the processing tank while the target object is arranged in the cleaning tank, so the target object is immersed in the process liquid, and the target object is cleaned while letting the process liquid overflow from the cleaning tank, the apparatus further comprising a cover configured to cover a liquid surface in the cleaning tank, a support member configured to support the cover, and a follow-up mechanism configured to move the cover such that the cover follows the liquid surface while the cover is supported by the support member.

In the first aspect of the present invention, the follow-up mechanism may operate to vertically move such that the follow-up mechanism follows at least the liquid surface. The follow-up mechanism may be moved to allow the cover to follow the liquid surface.

The cleaning apparatus may further comprise an opening/closing mechanism configured to open/close the cover. In this case, the cleaning apparatus may be arranged such that the process liquid supply mechanism is configured to selectively supply a plurality of process liquids to the cleaning tank; the cleaning apparatus further comprises a process liquid discharge mechanism configured to discharge the process liquid from the cleaning tank, and a control mechanism configured to control supply and discharge of the process liquid and opening and closing of the cover; and the control mechanism serves to control such that the cover is closed in at least part of a period of the plurality of processes in accordance with a processing sequence of the plurality of processes that are performed continuously while using a plurality of process liquids alternately in the cleaning tank. Further, the cover may be divided into two divisional pieces, and the cover opening/closing mechanism may include two driving mechanisms configured to open/close the cover by pivoting the two divisional pieces. In this case, the cleaning apparatus may be arranged such that the follow-up mechanism constitutes part of the cover opening/closing mechanism, and is arranged between the two driving mechanisms and the two divisional pieces, such that the follow-up mechanism is pivoted by the driving mechanisms together with the divisional pieces.

In the first aspect, the follow-up mechanism may include a slide mechanism or a parallelogram linkage mechanism. The cover opening/closing mechanism may further include a moving mechanism configured to move between a position for allowing the cover to follow the liquid surface and a position above the liquid surface, and the moving mechanism serves to move the cover upward when opening the cover.

In the first aspect, the cleaning apparatus may be arranged such that the cover is divided into two divisional pieces; the follow-up mechanism constitutes part of the cover opening/closing mechanism; the cover opening/closing mechanism includes two driving mechanisms configured to pivot the two divisional pieces respectively, two pivotal members attached to shafts of the two driving mechanisms and pivoted by the two driving mechanisms, two parallelogram linkages provided to the two driving mechanisms correspondingly for serving each as the follow-up mechanism and configured to support the two divisional pieces, respectively, and two cylinder mechanisms respectively attached to the two pivotal members and configured to move the two parallelogram linkages between a position for allowing the two parallelogram linkages to follow the liquid surface of the cover and a position above the liquid surface; and the two driving mechanisms is configured to pivot the two divisional pieces together with the two pivotal mechanisms, the two cylinder mechanisms, and the two parallelogram linkages, after the two cylinder mechanisms move the two parallelogram linkages to the position above the liquid surface, thereby opening the cover.

According to a second aspect of the present invention, there is provided a cleaning method for performing a cleaning process using a cleaning apparatus comprising a cleaning tank configured to store a process liquid used for cleaning a target object, a target object holding mechanism configured to hold the target object in the cleaning tank, a process liquid supply mechanism configured to supply the process liquid to the cleaning tank, a process liquid discharge mechanism configured to discharge the process liquid from the cleaning tank, and a cover configured to cover a liquid surface in the cleaning tank, the method comprising: arranging a target object in the cleaning tank, supplying the process liquid to the processing tank where the target object is arranged, thereby immersing the target object in the process liquid; and cleaning the target object while letting the process liquid overflow from the cleaning tank, wherein when cleaning the target object while letting the process liquid overflow, the cover is caused to follow the liquid surface.

In the second aspect of the present invention, the cleaning method may be arranged such that the cover is openable/closeable, a plurality of process liquids are used alternately in the cleaning tank for continuously performing a plurality of processes, and the cover is kept closed in at least part of a period of the plurality of processes in accordance with a processing sequence of the plurality of processes.

According to a third aspect of the present invention, there is provided a computer readable storage medium that stores a control program for execution on a computer for controlling a cleaning apparatus comprising a cleaning tank configured to store a process liquid used for cleaning a target object, a target object holding mechanism configured to hold the target object in the cleaning tank, a process liquid supply mechanism configured to supply the process liquid to the cleaning tank, a process liquid discharge mechanism configured to discharge the process liquid from the cleaning tank, and a cover configured to cover a liquid surface in the cleaning tank, wherein the control program, when executed, causes the computer to control a cleaning apparatus to conduct a cleaning method comprising arranging a target object in the cleaning tank, supplying the process liquid to the processing tank where the target object is arranged, thereby immersing the target object in the process liquid; and cleaning the target object while letting the process liquid overflow from the cleaning tank, wherein when cleaning the target object while letting the process liquid overflow, the cover is caused to follow the liquid surface.

According to the present invention, when cleaning a target object by letting a process liquid overflow while the target object is kept immersed in the process liquid in a cleaning tank, a cover for covering a liquid surface in the cleaning tank, a support member for supporting the cover, and a follow-up mechanism for moving the cover such that the cover follows the liquid surface while the cover is supported by the support member are provided. Thus, the cover can be brought into tight contact with the liquid surface during the cleaning process, and contact of a gas with the process liquid can be minimized. This can decrease dissolution of the gas into the process liquid, thereby improving uniformity in the cleaning process.

It may be arranged such that the cover can be opened and closed, and a plurality of process liquids can be supplied to the cleaning tank. With this arrangement, in performing a plurality of processes continuously by using a plurality of process liquids alternately in the cleaning tank, the cover can be controlled to be closed at least during some period in the plurality of processes in accordance with the process sequence of the plurality of processes. Specifically, where a cleaning process is less affected by gas dissolution while covering the liquid surface with the cover can disorder the liquid, the cover may be kept open. In this case, only where a cleaning process is substantially affected by gas dissolution, the cover is closed.

BEST MODE FOR CARRYING OUT THE INVENTION

An embodiment of the present invention will be described in detail. This embodiment will be exemplified by a case in which the present invention is applied to a one-path cleaning apparatus.

Figure 1:
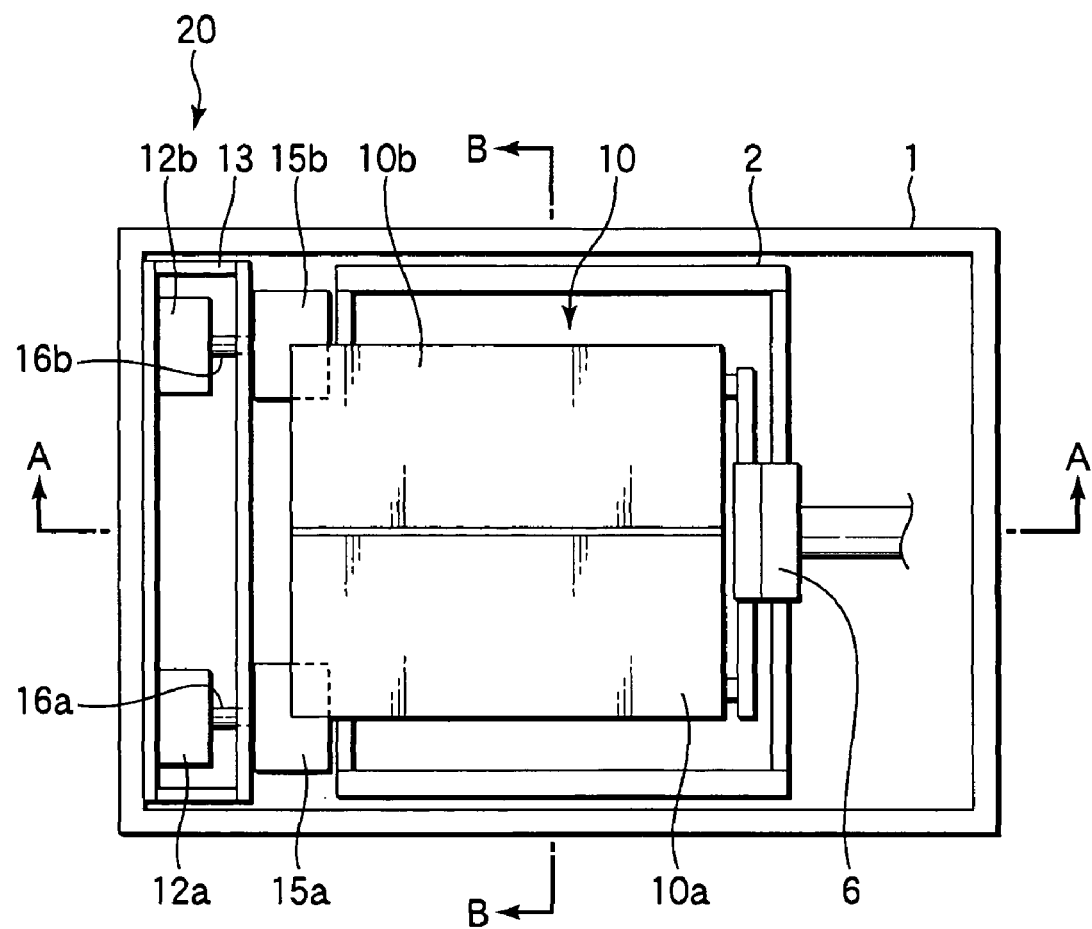
FIG. 1 This is a plan view showing a cleaning apparatus according to an embodiment of the present invention.
Figure 2:
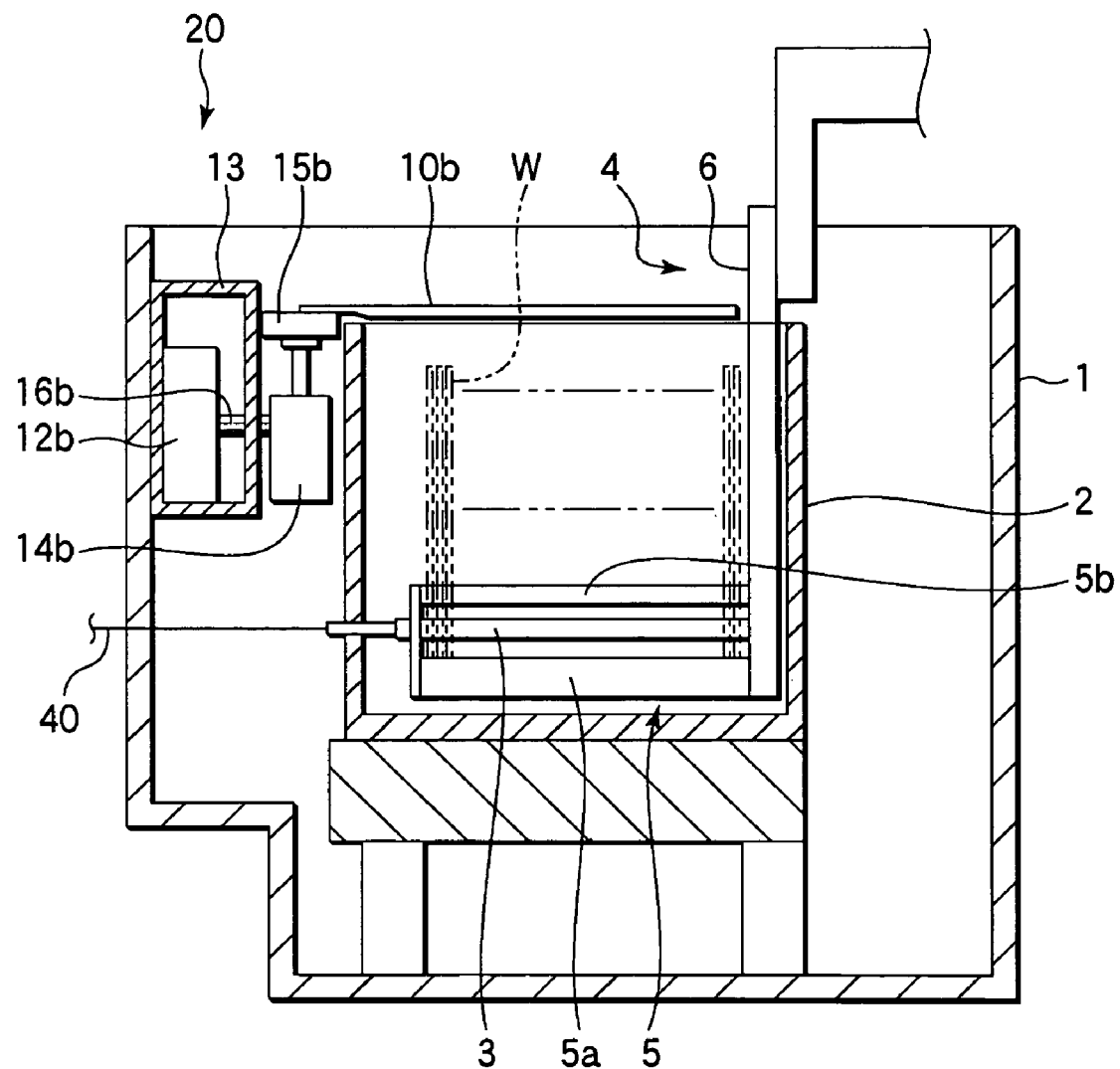
FIG. 2 This is a sectional view taken along the line A-A of FIG. 1.
Figure 3:
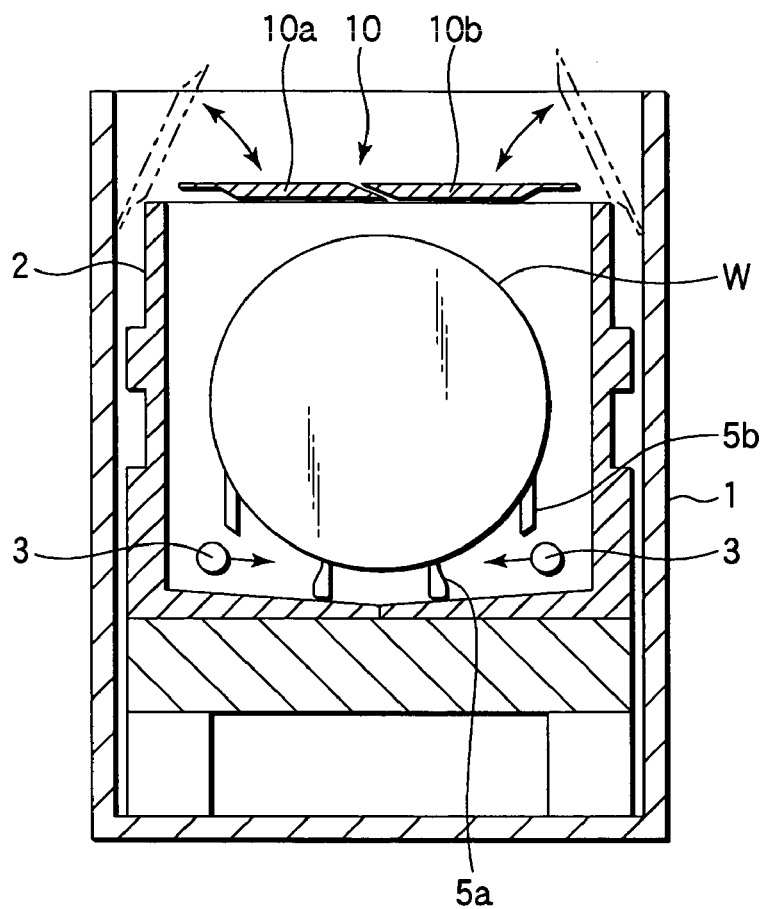
FIG. 3 This is a sectional view taken along the line B-B of FIG. 1.

FIG. 1 is a plan view showing a cleaning apparatus according to an embodiment of the present invention, FIG. 2 is a sectional view taken along the line A-A of the same, and FIG. 3 is a sectional view taken along the line B-B of the same.

The cleaning apparatus according to this embodiment has a housing 1 and a cleaning tank 2 arranged in the housing 1. A predetermined process liquid is to be stored in the cleaning tank 2. As will be described later, the predetermined process liquid is supplied from a predetermined supply source into the cleaning tank 2 through nozzles 3 (see FIGS. 2 and 3) provided in the cleaning tank 2 and serving as a process liquid supply mechanism, thereby storing the process liquid in the cleaning tank 2. A plurality of wafers W are immersed in the process liquid, and a cleaning process takes place while the process liquid overflows from the cleaning tank 2. The overflowing process liquid flows to an outer tank (not shown).

In the cleaning tank 2, a wafer holding member 4 holds a plurality of, e.g., 50 wafers W. The wafer holding member 4 has a wafer holding portion 5 for holding the wafers W upright in the horizontal direction, and a support 6 extending from the end of the wafer holding portion 5 upward along the inner wall of the cleaning tank 2 to support the wafer holding portion 5. A driving mechanism (not shown) vertically moves the wafer holding portion 5 through the support 6, thereby loading/unloading the wafers W into/from the cleaning tank 2. The wafers W are transferred to the wafer holding member 4 by an appropriate transfer unit. The wafer holding portion 5 has first holding rods 5a for holding the wafers W at portions near their lower ends, and second holding rods 5b for holding the wafers W at portions slightly above the portions held by the first holding rods 5a. The first and second holding rods 5a and 5b have a plurality of grooves for holding the wafers W.

A cover 10 is arranged on the liquid surface of the cleaning tank 2 to be capable of following the liquid surface and being opened/closed. The cover 10 is halved into divisional pieces 10a and 10b at the center. A cover opening/closing mechanism 20 pivots the divisional pieces 10a and 10b, thereby opening/closing the cover 10. The mating surfaces of the divisional pieces 10a and 10b are oblique. Thus, upon closing the divisional pieces 10a and 10b, they do not interfere with each other and do not form a gap.

Figure 4:
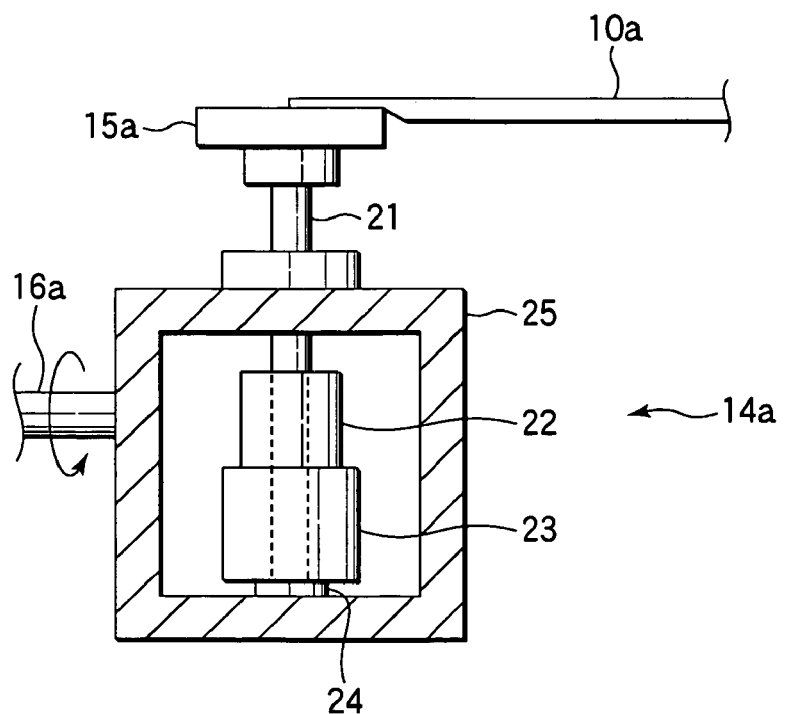
FIG. 4 This is a sectional view showing the arrangement of a slide mechanism as a constituent element of a pivotal mechanism in the cleaning apparatus shown in FIGS. 1 to 3.

The cover opening/closing mechanism 20 has a casing 13, driving mechanisms 12a and 12b (see FIG. 2) capable of driving the divisional pieces 10a and 10b separately, and slide mechanisms 14a and 14b (see FIG. 4). The driving mechanisms 12a and 12b respectively comprise rotary actuators. The driving mechanisms 12a and 12b are respectively provided with rotatable shafts 16a and 16b. The slide mechanisms 14a and 14b are pivotally connected to the driving mechanisms 12a and 12b through the shafts 16a and 16b, respectively. The divisional pieces 10a and 10b are fixed to the upper portions of the slide mechanisms 14a and 14b through support plates 15a and 15b, respectively. The cover 10 is made of, e.g., a fluoroplastic, and floats on the surface of the process liquid. When the slide mechanisms 14a and 14b slide, the cover 10 can follow the liquid surface in the cleaning tank 2. Namely, the slide mechanisms 14a and 14b also serve as mechanisms that cause the cover 10 to follow the liquid surface.

The cover 10 serves to prevent the cleaning process from becoming less uniform due to a gas dissolving into the process liquid, and preferably covers the liquid surface in the cleaning tank 2 as large an area as possible. However, the process liquid must overflow from the cleaning tank 2. If the cover is present in the overflowing portion, it interferes with the overflowing. Also, a space for the support member 6 of the wafer holding member 4 must be reserved.

As shown in FIG. 4, the slide mechanism 14a comprises a base box 25 fixed to the shaft 16a horizontally extending from the driving mechanism 12a, a shaft 21 having one end fixed to the support plate 15a and extending in the base box 25, a linear bush 22 arranged in the base box 25 and serving to guide the shaft 21 to be linearly movable, a bracket 23 arranged under the linear bush 22 and serving to stop the shaft 21 at an arbitrary position, and a stopper 24 of the shaft 21 arranged under the bracket 23. The slide mechanism 14b has completely the same arrangement.

As the slide mechanisms 14a and 14b have the above arrangement, when the cover 10 covers the liquid surface and is floated by the buoyancy of the process liquid, even if the liquid level changes, the slide mechanisms 14a and 14b slide to vertically move the cover 10 such that the cover follows the change in the liquid level.

Figure 5:
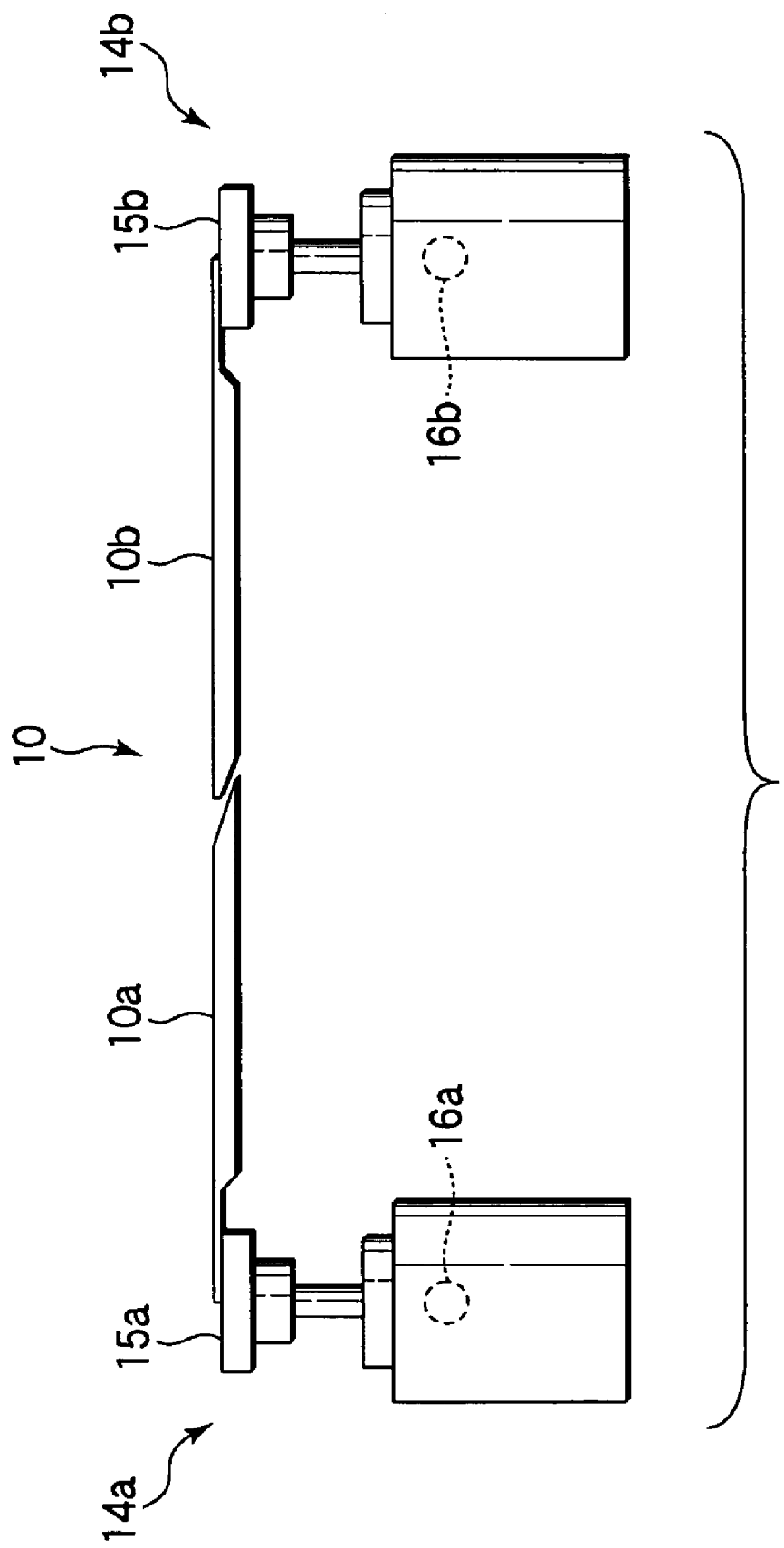
FIG. 5 This is a front view schematically showing a state in which a cover covers a liquid surface in the cleaning apparatus shown in FIGS. 1 to 3.
Figure 6:
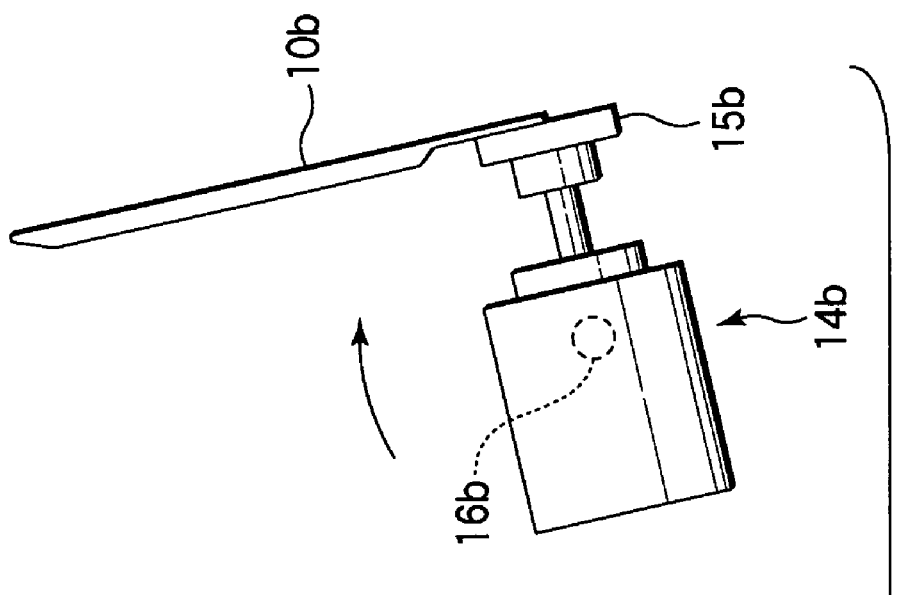
FIG. 6 This is a front view schematically showing a state in which the cover is open in the cleaning apparatus shown in FIGS. 1 to 3.
Figure 6:
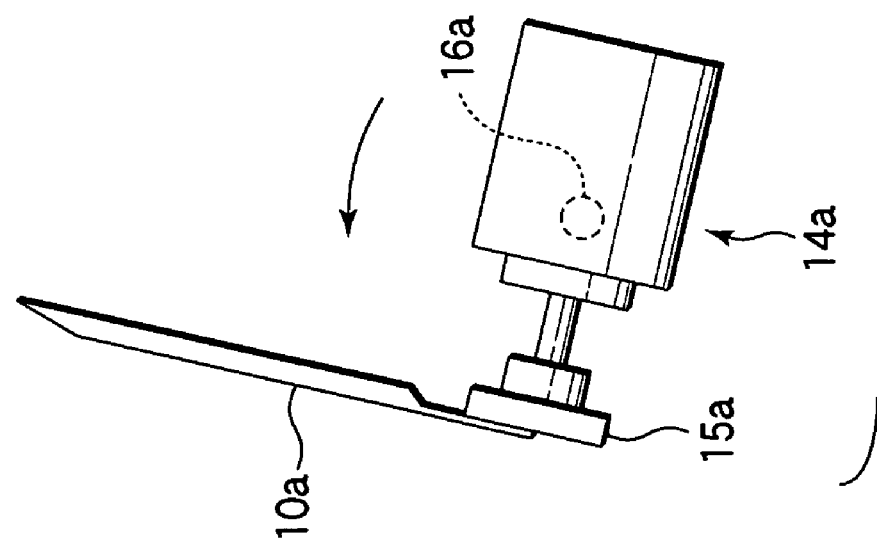

When the cover 10 covers the liquid surface, the slide mechanisms 14a and 14b are at the positions as shown in FIG. 5. When the driving mechanisms 12a and 12b comprising the rotary actuators rotate the shafts 16a and 16b, as shown in FIG. 6, the divisional pieces 10a and 10b of the cover 10 pivot together with the slide mechanisms 14a and 14b and the shafts 16a and 16b, so that the cover 10 is opened.

Figure 7:
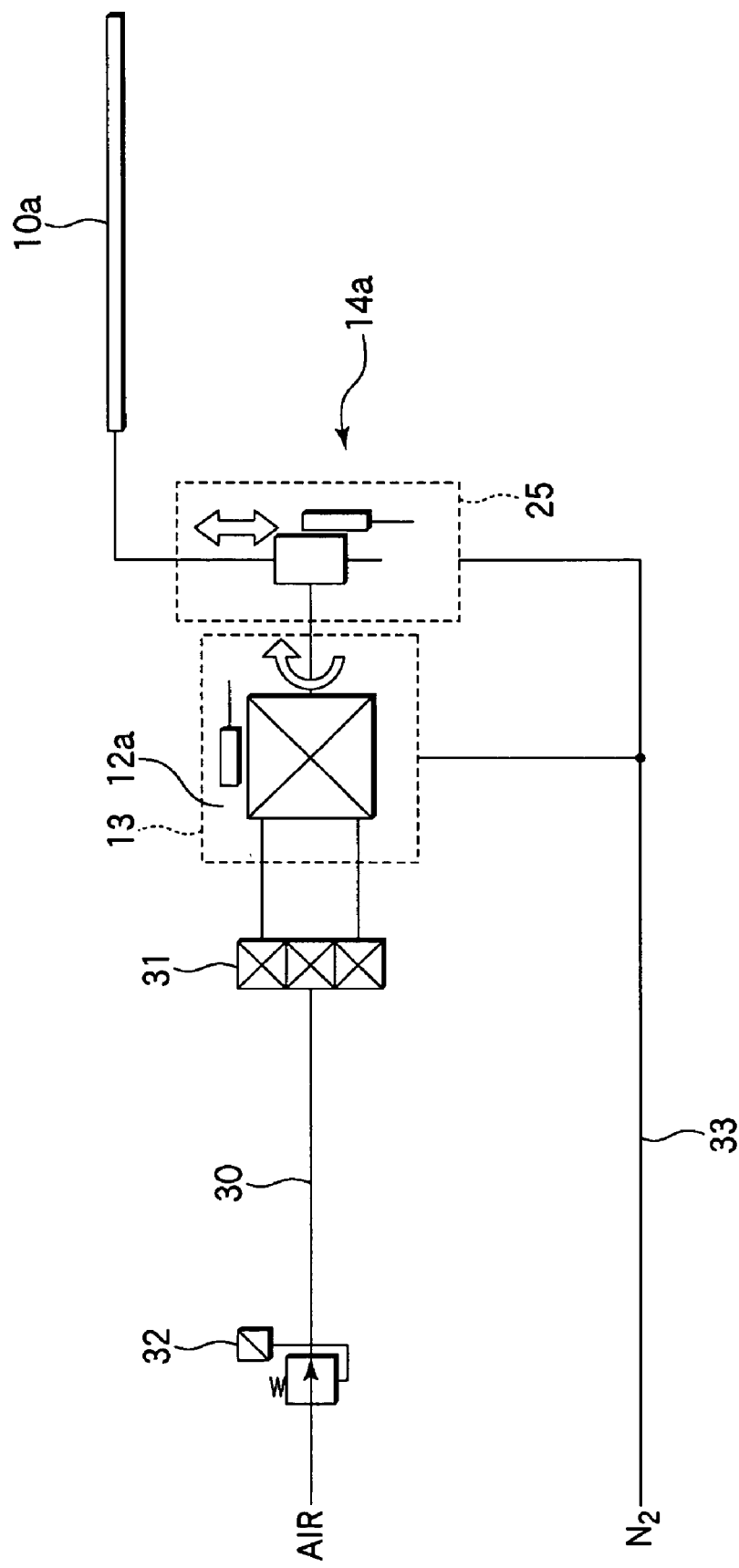
FIG. 7 This is a view showing a piping diagram of air for driving a driving mechanism in the cover opening/closing mechanism of the cleaning apparatus shown in FIGS. 1 to 3 and a piping diagram of $N_2$ gas to be introduced to a casing.

The driving mechanism 12a comprising the rotary actuator is driven when air is supplied to it through a pipe 30, as shown in the piping diagram in FIG. 7. The driving mechanism 12a is actually driven when a controller (not shown) controls a solenoid valve 31 provided to the pipe. The driving mechanism 12b has completely the same arrangement. Reference numeral 32 denotes a regulator. In order to prevent oxidation or the like of the driving unit, $N_2$ gas is introduced into the casing 13 and the base boxes 25 in the slide mechanisms 14a and 14b through pipes 33.

Figure 8:
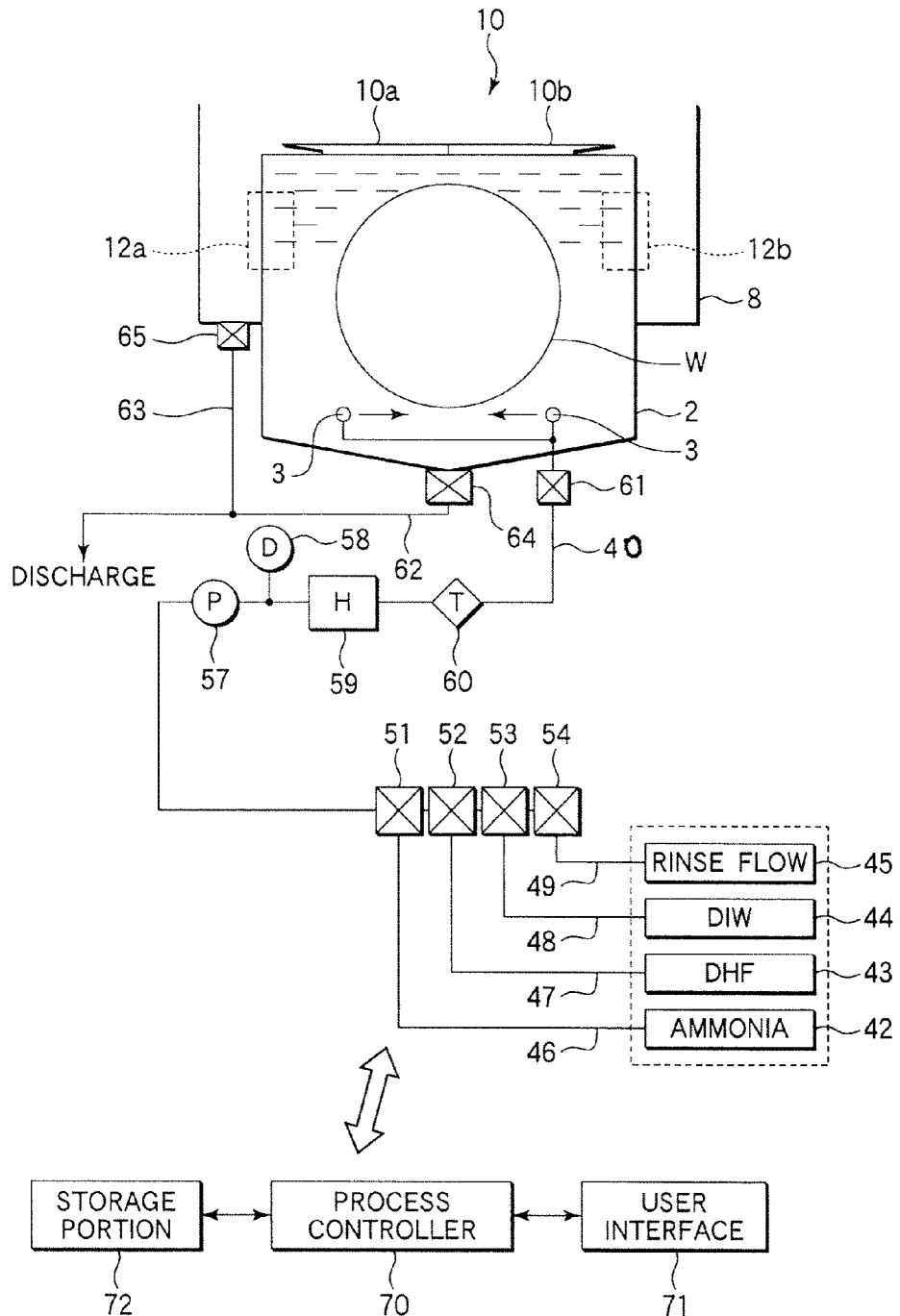
FIG. 8 This is a schematic view showing supply and discharge of a process liquid in the cleaning apparatus and control of the cleaning apparatus according to the embodiment of the present invention.

Supply and discharge of the process liquid in the cleaning apparatus of this embodiment, and control of the cleaning apparatus will be described with reference to FIG. 8.

An outer tank 8 for receiving the overflowing process liquid is arranged outside the cleaning tank 2. A process liquid supply pipe 40 for supplying the process liquid is connected to the nozzles 3 in the cleaning tank 2. A process liquid supply unit 41 is arranged at the other end of the process liquid supply pipe 40. The process liquid supply unit 41 has an ammonia supply source 42 for supplying ammonia, a DHF supply source 43 for supplying diluted hydrofluoric acid (DHF), a DIW supply source 44 for supplying purified water (DIW), and a rinsing liquid supply source 45 for supplying a rinsing liquid such as isopropyl alcohol (IPA). Pipes 46, 47, 48, and 49 extending from the supply sources 42, 43, 44, and 45 are connected to the process liquid supply pipe 40 through switching valves 51, 52, 53, and 54, respectively. Thus, upon manipulating the switching valves 51, 52, 53, and 54, ammonia, diluted hydrofluoric acid (DHF), purified water (DIW), and rinsing liquid can be selectively supplied as the process liquid to the cleaning tank 2.

The process liquid supply pipe 40 is provided with a pump 57, a damper 58, a heater 59, a filter 60, and an switching valve 61 sequentially from the upstream side. Upon operating the pump 57, a predetermined process liquid is supplied toward the cleaning tank 2. The heater 59 heats the process liquid to a predetermined temperature. The filter 60 removes impurities in the process liquid. Then, the process liquid is supplied to the cleaning tank 2.

Process liquid discharge pipes 62 and 63 are connected to the bottom of the cleaning tank 2 and the center of the bottom of the outer tank 8, respectively. Switching valves 64 and 65 are respectively connected to the process liquid discharge pipes 62 and 63. When replacing the process liquid, the switching valves 64 and 65 are opened for discharging the process liquid stored in the cleaning tank 2 and outer tank 8 through the process liquid discharge pipes 62 and 63. After that, the switching valves 64 and 65 are closed, and the next process liquid is supplied into the cleaning tank 2.

The respective constituent portions of the cleaning apparatus as described above, e.g., the switching valves provided to the respective pipes, the pump 57, the transfer mechanism for the wafers W, the driving mechanisms 12a and 12b for opening/closing the cover, and the like are connected to a process controller (control mechanism) 70 and controlled by it. The process controller 70 is connected to a user interface 71 comprising a keyboard through which the process manager inputs commands for managing the cleaning apparatus, a display for visually displaying the operation status of the cleaning apparatus, and the like.

The process controller 70 is also connected to a storage portion 72 which stores a control program for implementing the respective types of processes to be performed by the cleaning apparatus by control operation of the process controller 70, and a program, i.e., a recipe, for causing the respective constituent portions to perform the process in accordance with the processing conditions. The recipe may be stored in a hard disk or a semiconductor memory. Alternatively, the recipe may be stored in a portable storage medium such as a CDROM, a DVD, or the like, and the portable storage medium may be set at a predetermined position in the storage portion 72. Also, the recipe may be transferred appropriately from another apparatus via, e.g., a dedicated line.

As needed, upon instruction from the user interface 71, an arbitrary recipe is called from the storage portion 72 and performed by the process controller 70, thereby performing a desired process in the cleaning apparatus under the control of the process controller 70.

An example of the processing operation in the cleaning apparatus having the above arrangement will be described.

Figure 9:
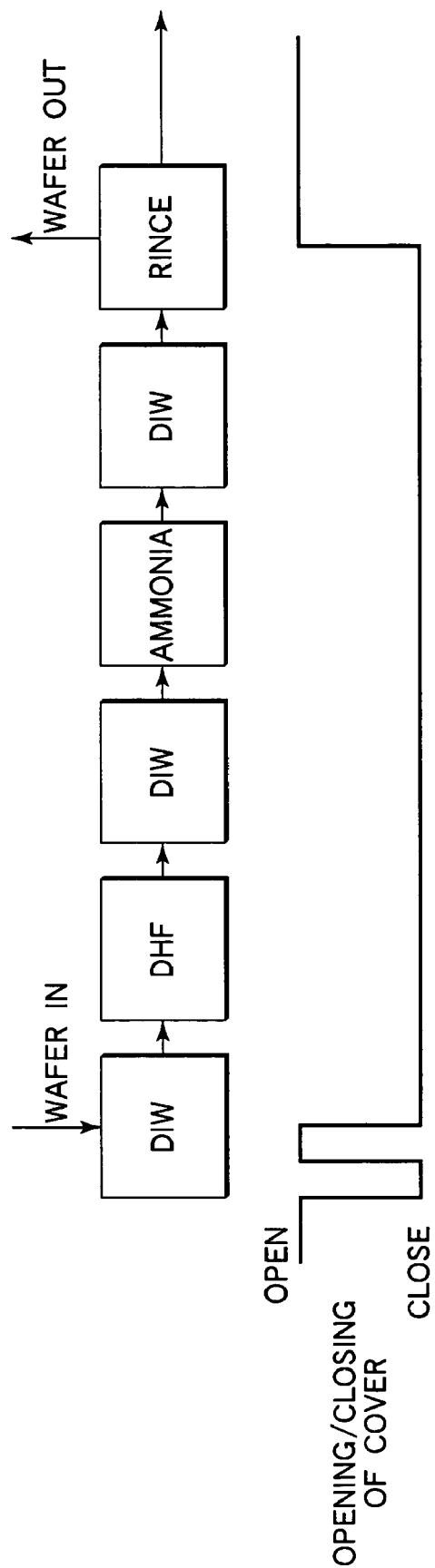
FIG. 9 This is a diagram for explaining an example of the process sequence and cover opening/closing operation in the cleaning process performed in the cleaning apparatus according to the embodiment of the present invention.
Figure 10:
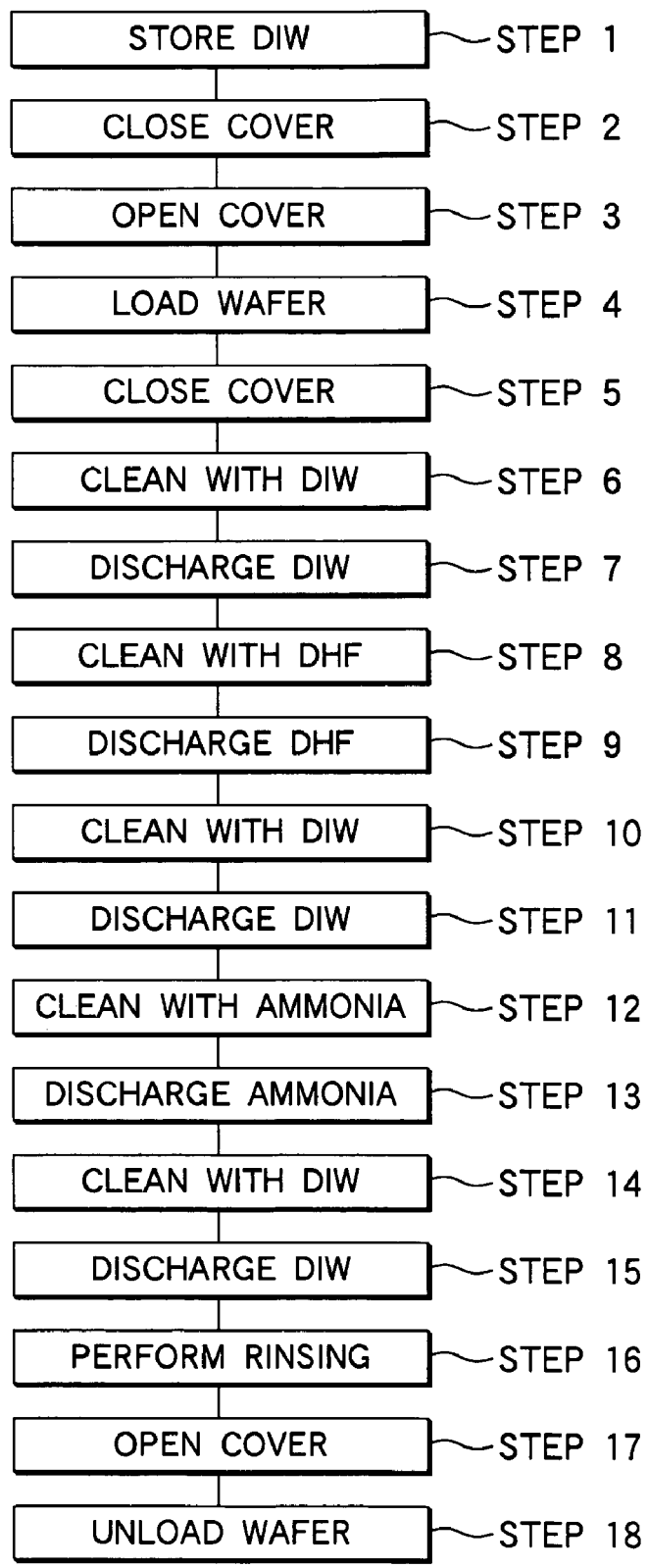
FIG. 10 This is a flowchart of the cleaning process in the cleaning apparatus according to the embodiment of the present invention.

The following explanation will be given of a case where the wafers W are to be cleaned with diluted hydrofluoric acid and then cleaned with ammonia. FIG. 9 is a diagram for explaining an example of the process sequence and cover opening/closing operation, and FIG. 10 is a flowchart of the cleaning process in this case.

First, in an empty state of the cleaning tank 2, the switching valves 53 and 61 are opened, the pump 57 is driven, and purified water (DIW) is supplied from the DIW supply source 44 into the cleaning tank 2 through the process liquid supply pipe 40 and nozzles 3, thereby filling the cleaning tank 2 with the purified water (DIW) (STEP 1). The cover opening/closing mechanism 20 keeps the cover 10 closed until the wafers W are immersed (STEP 2).

Subsequently, the cover opening/closing mechanism 20 opens the cover 10 (STEP 3). While the wafer holding portion 5 of the wafer holding member 4 is located above the cleaning tank 2, a plurality of, e.g., 50, wafers W are transferred by a transfer mechanism (not shown) to the wafer holding portion 5. A driving mechanism (not shown) moves the wafer holding member 4 downward, so the wafers W are immersed in the purified water (DIW) (STEP 4). When opening the cover 10 with the cover opening/closing mechanism 20, the driving mechanisms 12a and 12b comprising the rotary actuators rotate the shafts 16a and 16b, thereby pivoting the divisional pieces 10a and 10b through the slide mechanisms 14a and 14b, as shown in FIG. 6.

After immersing the wafers W in the process liquid in the cleaning tank 2, the cover opening/closing mechanism 20 closes the cover 10, so the liquid surface covered with the cover (STEP 5). In this case, the shafts 16a and 16b in the state shown in FIG. 6 of the rotary actuators 12a and 12b are rotated to change to the state shown in FIG. 5. In this state, the slide mechanisms 14a and 14b can move the cover 10 such that the cover 10 follows the liquid surface of the purified water. After covering the liquid surface with the cover 10, cleaning with the purified water (DIW) is performed while letting the purified water (DIW) overflow from the cleaning tank 2 (STEP 6).

After cleaning with the purified water (DIW) is finished, the switching valves 64 and 65 are opened, and the purified water (DIW) is discharged from the cleaning tank 2 and outer tank 8 through the process liquid discharge pipes 62 and 63 (STEP 7). Then, the switching valve 52 is opened. Diluted hydrofluoric acid (DHF) is supplied from the diluted hydrofluoric acid (DHF) supply source 43 into the cleaning tank 2. The cleaning process is performed while letting diluted hydrofluoric acid (DHF) overflow (STEP 8).

After that, diluted hydrofluoric acid (DHF) is discharged from the cleaning tank 2 and outer tank 8 in accordance with the same procedure as in STEP 7 (STEP 9). Then, purified water (DIW) is supplied into the cleaning tank 2 in accordance with the same procedure as in STEP 1. A cleaning process is performed while letting the purified water (DIW) overflow (STEP 10).

After that, the purified water (DIW) is discharged from the cleaning tank 2 and outer tank 8 in accordance with the same procedure as in STEP 7 (STEP 11). Then, the switching valve 51 is opened, and ammonia is supplied from the ammonia supply source 42 into the cleaning tank 2. A cleaning process is performed while letting ammonia overflow (STEP 12).

After that, ammonia is discharged from the cleaning tank 2 and outer tank 8 in accordance with the same procedure as in STEP 7 (STEP 13). Then, purified water (DIW) is supplied into the cleaning tank 2 in accordance with the same procedure as in STEP 1. A cleaning process is performed while letting the purified water (DIW) overflow (STEP 14).

After that, the purified water (DIW) is discharged from the cleaning tank 2 and outer tank 8 in accordance with the same procedure as in STEP 7 (STEP 15). Then, the switching valve 54 is opened. A rinsing liquid is supplied from the rinsing liquid supply source 45 into the cleaning tank 2, thereby performing a rinsing process (STEP 16).

After the rinsing process is finished, the cover opening/closing mechanism 20 opens the cover (STEP 17). The wafer holding member 4 is moved to above the cleaning tank 2. The plurality of wafers held by the wafer holding portion 5 are transferred to the transfer mechanism (not shown) (STEP 18).

During the above cleaning process, the cover 10 always covers the liquid surface of the cleaning tank 2 except for loading and unloading of the wafers W. In addition, when the cover 10 is mounted on the liquid surface, the slide mechanisms 14a and 14b move the cover 10 such that the cover 10 can follow the liquid surface. Therefore, the cover 10 can always be in contact with the liquid surface. This suppresses any gas to be in contact with that portion of the liquid surface where the cover 10 exists. Therefore, the cleaning process is prevented from becoming less uniform due to a gas dissolving into the process liquid. More specifically, this cleaning process is typically performed in air. Without the cover, oxygen in air dissolves into the process liquid and adversely affects the cleaning process. This hardly occurs in this embodiment.

According to this embodiment, the cover opening/closing mechanism 20 has the driving mechanisms 12a and 12b comprising the rotary actuators. The driving mechanisms 12a and 12b respectively rotate the shafts 16a and 16b, thereby pivoting the divisional pieces 10a and 10b of the cover 10 together with the slide mechanisms 14a and 14b. The cover 10 can be opened/closed with such a comparatively simple mechanism and simple operation. As the follow-up mechanism, the slide mechanisms which are moved for allowing the cover to follow the liquid surface are provided. Therefore, the facilities do not become bulky. When loading and unloading the wafers W, the cover 10 does not interfere with the wafers W.

Figure 11:
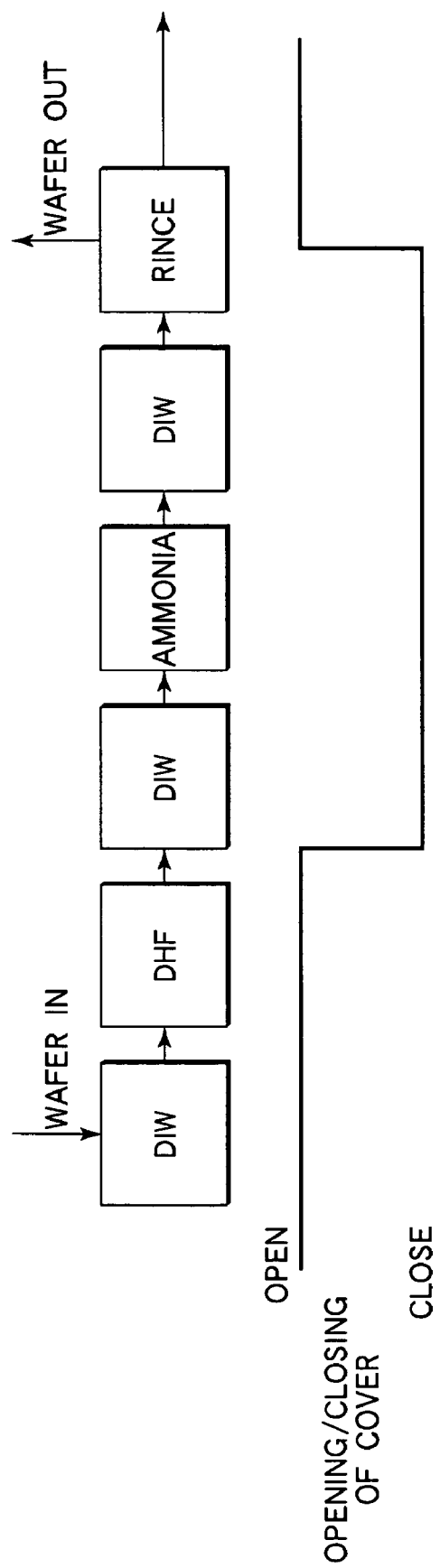
FIG. 11 This is a diagram for explaining another example of the cover opening/closing operation in the process sequence shown in FIG. 9.

In the explanation described above, the cover 10 covers the liquid surface during the period except for loading and unloading of the wafers W. The cover 10 need not always cover the liquid surface during the entire processing period. More specifically, if dissolution of the gas does not largely adversely affect the cleaning process and covering the liquid surface with the cover may undesirably disorder the liquid, the process may be performed with the cover open. For example, the influence of diluted hydrofluoric acid (DHF) upon coming into contact with a gas is comparatively small. Depending on the conditions, existence of the cover may impair the uniformity of the liquid flow. Therefore, of the processing sequence described above, as shown in FIG. 11, the processes until the diluted hydrofluoric acid (DHF) process may be performed with the cover 10 open. When performing the partial chemical process with the cover closed, the cover is preferably kept closed continuously from the purified water (DIW) process prior to the chemical process. This can prevent the chemical liquid more effectively from coming into contact with the gas. In the example of FIG. 11, the cover 10 is closed prior to the purified water (DIW) process before the ammonia process. This can minimize contact of ammonia in the cleaning tank 2 with the gas in the ammonia process.

A modification of the cover opening/closing mechanism will be described.

Figure 12:
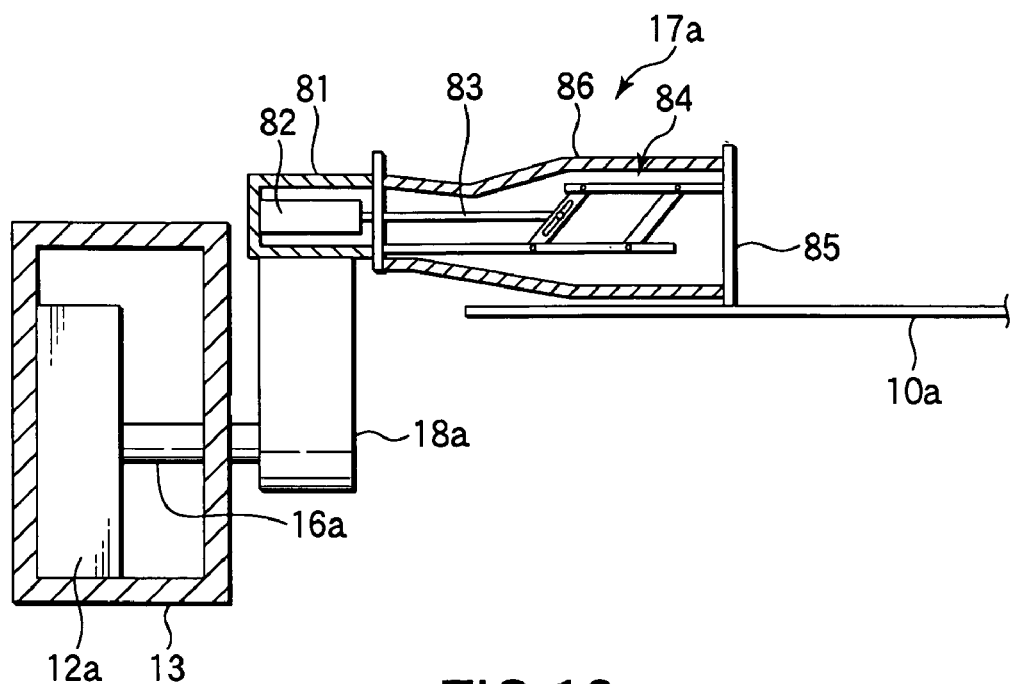
FIG. 12 This is a partially sectional side view showing a modification of the cover opening/closing mechanism.
Figure 13:
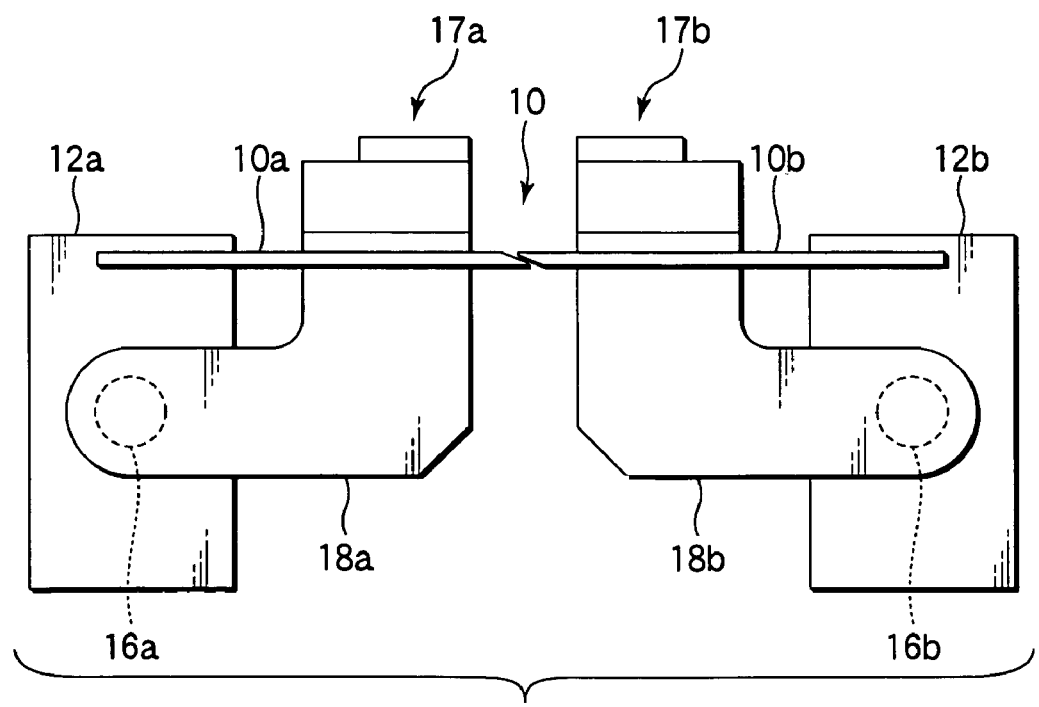
FIG. 13 This is a front view of the modification of the cover opening/closing mechanism.

FIG. 12 is a partially sectional side view for explaining the arrangement of a cover opening/closing mechanism according to this modification, and FIG. 13 is a front view of the cover opening/closing mechanism according to this modification. In this case, a cover opening/closing mechanism 20' has the casing 13 and the driving mechanisms 12a and 12b comprising rotary actuators, which are arranged in the same manner as in the above cover opening/closing mechanism 20. In addition, the cover opening/closing mechanism 20' also has lifter mechanisms 17a and 17b and pivotal members 18a and 18b. The lifter mechanisms 17a and 17b move the divisional pieces 10a and 10b between a position where they can follow the liquid surface, and a position above the liquid surface. The pivotal members 18a and 18b are respectively attached to the shafts 16a and 16b of the driving mechanisms 12a and 12b, support the lifter mechanisms 17a and 17b, and pivot when the shafts 16a and 16b rotate, thereby pivoting the divisional pieces 10a and 10b through the lifter mechanisms 17a and 17b.

The lifter mechanism 17a has a casing 81 fixed to the upper end of the pivotal member 18a, a cylinder mechanism 82 arranged in the casing 81 and comprising a piston 83 which advances/retracts in the horizontal direction, a parallelogram linkage 84 which can be moved by the piston 83, a connection member 85 for connecting one horizontal link of the parallelogram linkage 84 to the divisional piece 10a of the cover 10, and a flexible casing 86 for covering the parallelogram linkage 84. When the piston 83 is advanced, the parallelogram linkage 84 is set free, as shown in FIGS. 12 and 13, and the divisional piece 10a can move such that it follows the liquid surface of the cleaning tank 2. The lifter mechanism 17b has completely the same arrangement. When the parallelogram linkage 84 is free, the divisional piece 10b can move such that it can follow the liquid surface of the cleaning tank 2. Namely, the parallelogram linkages 84 also serve as a mechanism for moving the cover 10 such that the cover 10 follows the liquid surface.

When the pistons 83 of the cylinder mechanisms 82 are retracted from the state shown in FIGS. 12 and 13, the vertical links of the parallelogram linkages 84 become upright, and the divisional pieces 10a and 10b are moved upward and locked. In this state, the cover 10 has moved upward from the liquid surface.

Figure 16:
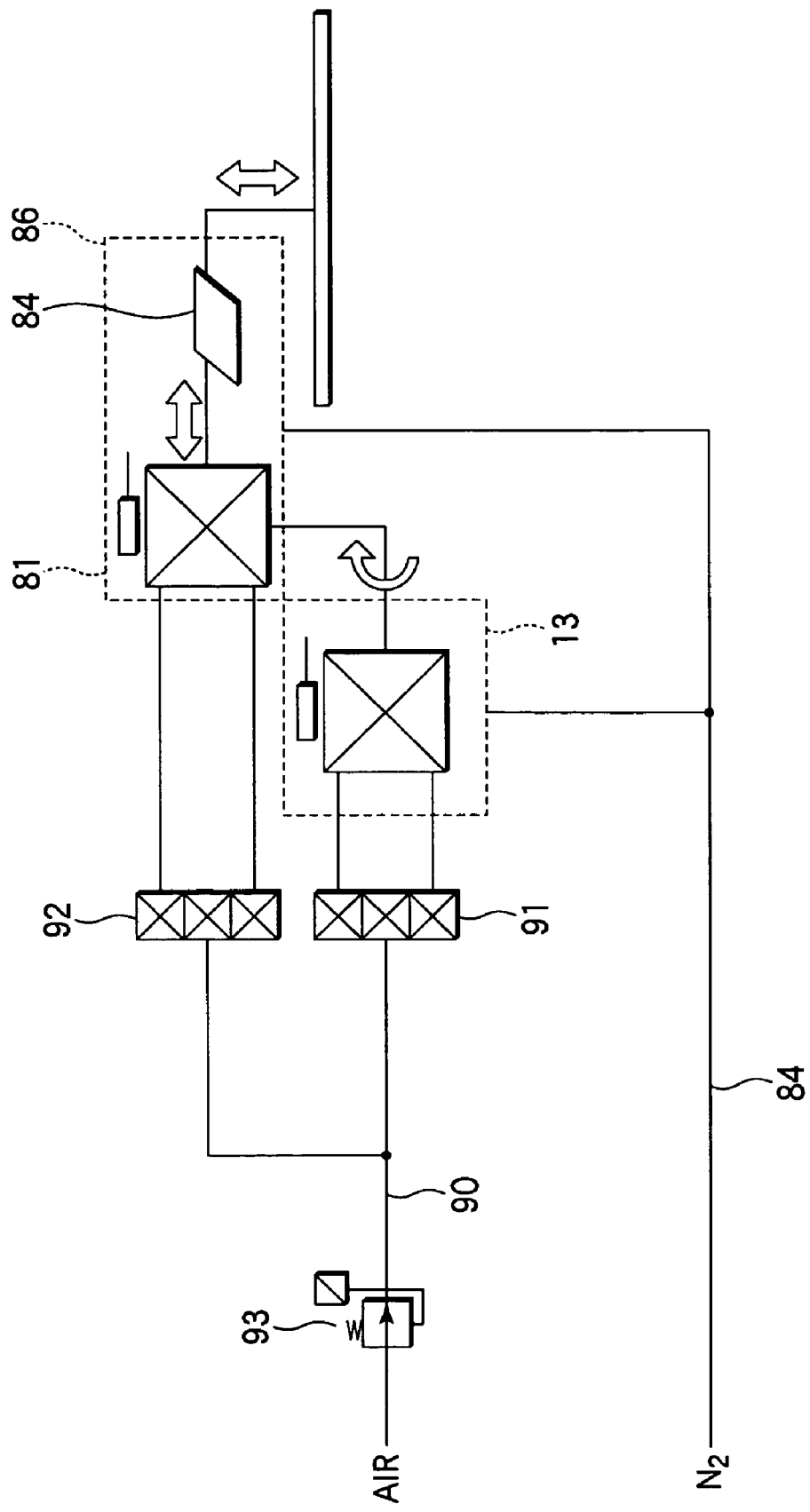
FIG. 16 This is a view showing a piping diagram of air for driving a driving mechanism comprising a rotary actuator and a cylinder mechanism and a piping diagram of $N_2$ gas to be introduced to a casing, in the modification of the cover opening/closing mechanism.

The driving mechanism 12a comprising the rotary actuator and the cylinder mechanism 82 of the lifter mechanism 17a are driven when air is supplied to them through a pipe 90, as shown in the piping diagram of FIG. 16. In actual driving, the driving mechanism 12a is driven by controlling a solenoid valve 91 provided to the pipe by a controller (not shown), and the cylinder mechanism 82 is driven by controlling a solenoid valve 92 provided to the pipe by a controller (not shown). This also applies to the driving mechanism 12b and lifter mechanism 17b. Reference numeral 93 denotes a regulator. To prevent oxidation or the like of the driving unit, $N_2$ gas is supplied into the casings 13, 81, and 86 through a pipe 94.

Figure 17:
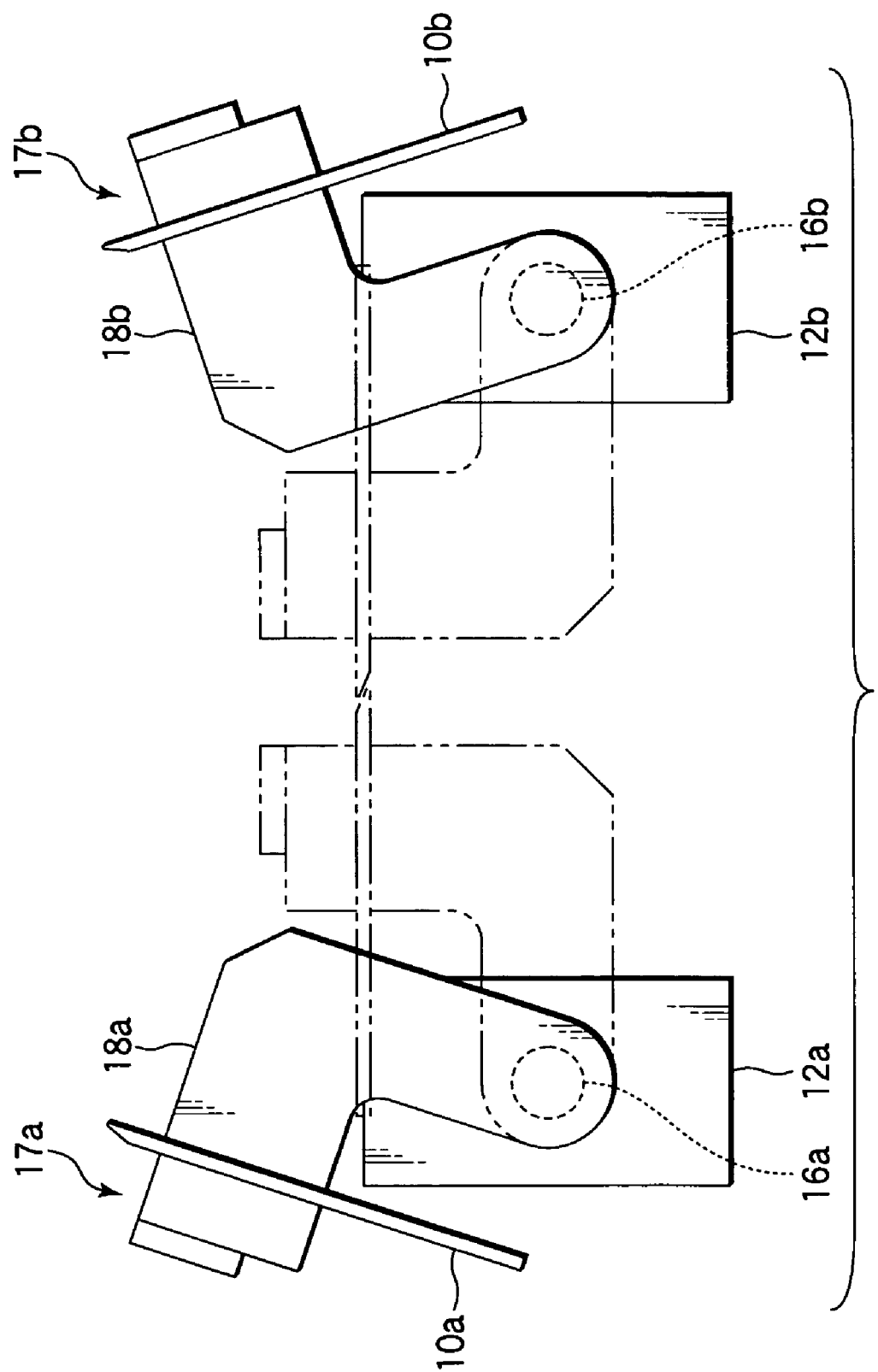
FIG. 17 This is a front view showing a state in which the cover is open in the modification of the cover opening/closing mechanism.

In the cover opening/closing mechanism 20' having the above arrangement, when the cover 10 covers the liquid surface, the parallelogram linkages 84 of the lifter mechanisms 17a and 17b are set free, so the divisional pieces 10a and 10b of the cover 10 can follow the liquid surface, as shown in FIGS. 12 and 13. To open the cover in this state, first, the pistons 83 of the cylinder mechanisms 82 of the lifter mechanisms 17a and 17b are retracted for setting the vertical links of the parallelogram linkages 84 upright. Thus, the divisional pieces 10a and 10b are moved to above the liquid surface through the connection member 85, so they are set in the state in FIGS. 14 and 15. Then, the shafts 16a and 16b of the driving mechanisms 12a and 12b are rotated outward for pivoting the divisional pieces 10a and 10b through the pivotal members 18a and 18b and lifter mechanisms 17a and 17b, thereby achieving the state as shown in FIG. 17. Namely, the cover 10 is opened by two operations, i.e., the operation of moving the divisional pieces 10a and 10b upward and the operation of pivoting them.

Figure 14:
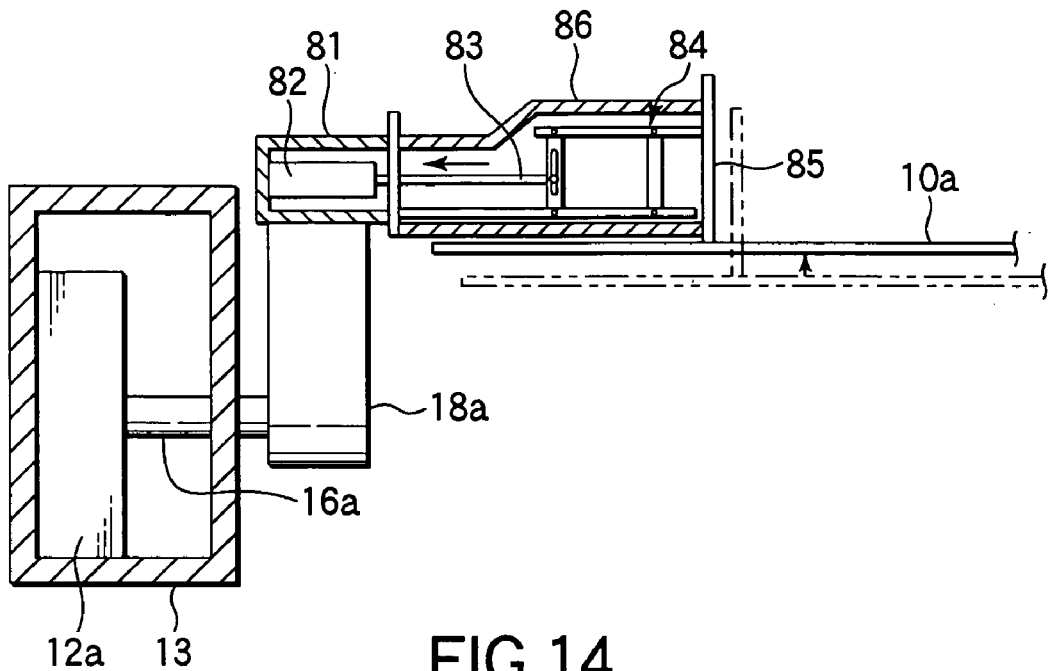
FIG. 14 This is a partially sectional side view showing a state in which the cover located on the liquid surface is moved upward in the modification of the cover opening/closing mechanism.
Figure 15:
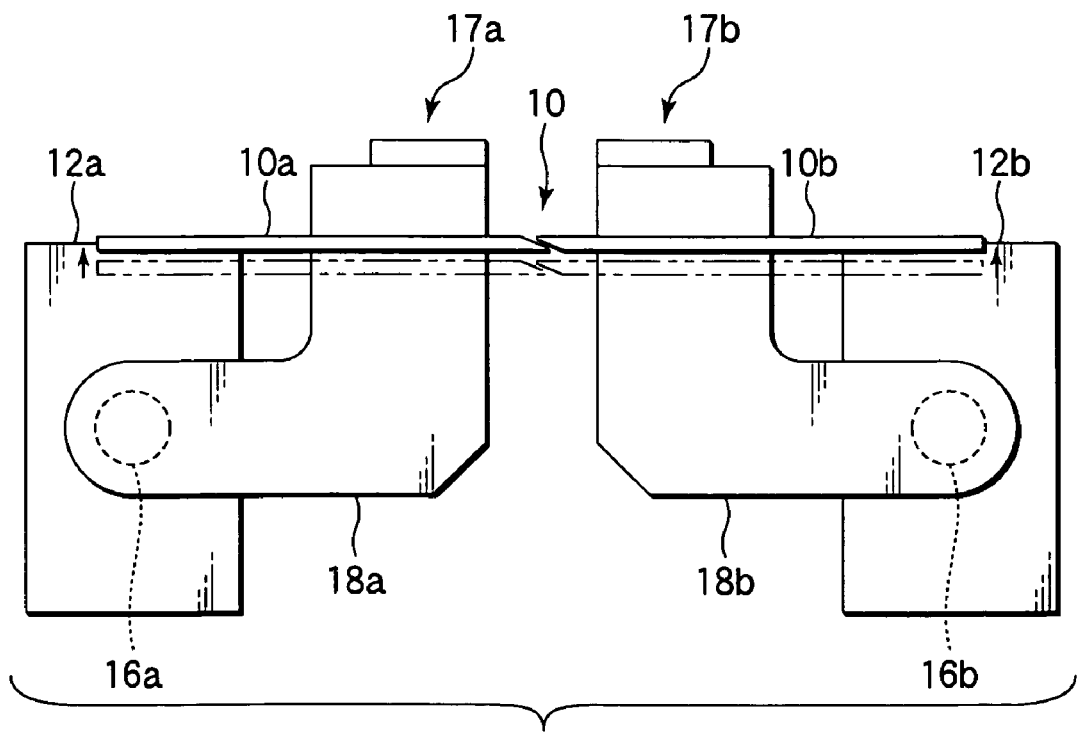
FIG. 15 This is a front view showing a state in which the cover located on the liquid surface is moved upward in the modification of the cover opening/closing mechanism.

When closing the cover 10 again, in the state in FIG. 16, the shafts 16a and 16b of the driving mechanisms 12a and 12b are rotated inward for moving the divisional pieces 10a and 10b toward the liquid surface through the pivotal members 18a and 18b and lifter mechanisms 17a and 17b, thereby achieving the state in FIGS. 14 and 15. Then, the pistons 83 of the cylinder mechanisms 82 of the lifter mechanisms 17a and 17b are advanced for setting the parallelogram linkages 84 free, so that the divisional pieces 10a and 10b follow the liquid surface.

In the cover opening/closing mechanism 20' as described above, when the cover 10 is mounted, the parallelogram linkages 84 of the lifter mechanisms 17a and 17b enable the cover 10 to follow the liquid surface. Thus, the cover 10 can always be in contact with the liquid surface, and contact of any gas with that portion of the liquid surface where the cover 10 exists is suppressed. This can prevent dissolution of the gas into the process liquid, thus preventing the cleaning process from being less uniform. The shafts 16a and 16b of the driving mechanisms 12a and 12b are rotated for pivoting the divisional pieces 10a and 10b of the cover 10 together with the pivotal members 18a and 18b and the lifter mechanisms 17a and 17b. The cover 10 can be opened/closed with this comparatively simple mechanism and simple operation. Also, as the follow-up mechanisms, the parallelogram linkages which are moved for allowing the cover to follow the liquid surface are provided. Thus, the facilities do not become bulky. When loading and unloading the wafers W, the cover 10 does not interfere with the wafers W. In addition, when opening the cover 10, its divisional pieces 10a and 10b are pivoted after they are temporarily moved upward from the liquid surface. This can avoid inconveniences such as splashing the process liquid or disordering the liquid surface. In the cover opening/closing mechanism 20 described above, a mechanism that moves the divisional pieces 10a and 10b upward can similarly be provided. When opening the cover 10, its divisional pieces 10a and 10b can be pivoted after they are temporarily moved upward from the liquid surface.

The present invention is not limited to the above embodiment, and various changes and modifications may be made within the spirit and scope of the invention. For example, the above embodiment is exemplified by a one-path cleaning apparatus. However, the present invention is not limited to this, but can be applied to any cleaning apparatus of the type that cleans a target object while letting the process liquid overflow from the cleaning tank.

In the above embodiment, the cover is of a divisional type divided into halves. Alternatively, the cover may comprise a single cover. In this case, a cover opening/closing mechanism, a follow-up mechanism, and the like having the same arrangements as those described above may be provided to only one side of the cover. In the above embodiment, the cover divided into halves opens like so-called double doors. Alternatively, the cover may be opened by other methods, e.g., sliding or folding. The number to divide the cover is not limited to 2, but may be 3 or more.

In the above embodiment, rotary actuators are used as the driving mechanisms used when opening the cover. However, the present invention is not limited to this.

The mechanism that causes the cover to follow the liquid surface is not limited to that described in the above example. For example, in the above embodiment, a slide mechanism or a parallelogram linkage which is moved for allowing the cover to follow the liquid surface is employed as the follow-up mechanism. Alternatively, the cleaning tank may be provided with a liquid level sensor. The follow-up mechanism may be driven actively on the basis of the liquid level detected by the liquid level sensor. In addition to the liquid level sensor, the follow-up mechanism may be actively controlled on the basis of a value obtained by monitoring the injection amount of process liquid, or the value of the injection amount prescribed in the recipe.

In the above embodiment, the cover moves vertically such that it follows the liquid surface. Alternatively, the cover may move differently, e.g., may slide on the liquid surface.

In the case of the process using the plurality of process liquids described in the above embodiment, the chemical liquids are not limited to those described above, but various types of chemical liquids can be employed. In the embodiment, semiconductor wafers are employed as the target objects. Alternatively, the present invention can similarly be applied to the cleaning process for other target objects, e.g., liquid crystal display (LCD) substrates.

INDUSTRIAL APPLICABILITY

The present invention is suitable to a cleaning process in general in which a target object such as a semiconductor wafer is immersed in a cleaning liquid and is cleaned while letting the cleaning liquid overflow.

The invention claimed is:

1. A cleaning apparatus comprising:
    a cleaning tank configured to store a process liquid used for cleaning a plurality of target objects;
    a target object holding mechanism configured to hold the target objects in the cleaning tank; and
    a process liquid supply mechanism configured to supply the process liquid to the cleaning tank,
    wherein the process liquid is supplied to the processing tank while the target objects are arranged in the cleaning tank, so the target objects are immersed in the process liquid, and the target objects are cleaned while letting the process liquid overflow from the cleaning tank,
    the apparatus further comprising
    a cover configured to cover, in contact therewith, a liquid surface in the cleaning tank, the cover being formed of first and second cover portions, separately from each other, and
    first and second support structures disposed outside the cleaning tank and configured to support the first and second cover portions, respectively, such that the cover is opened by swinging the first and second cover portions outward into a state where the first and second cover portions are away from each other to allow the target objects to be loaded and unloaded relative to the cleaning tank, and the cover is close by swinging the first and second cover portions inward into a state where the first and second cover portions engage with each other at a central portion of the cleaning tank,
    wherein each portion of the first and second support structures includes
    a follow-up mechanism configured for a corresponding cover portion of the first and second cover portions to move in a vertical direction while the corresponding cover portion follows the liquid surface in the cleaning tank and keeps in contact therewith, and
    a rotary mechanism connected to the corresponding cover portion through the follow-up mechanism and configured to swing the corresponding cover portion along with the follow-up mechanism.

2. The cleaning apparatus according to claim 1, wherein the follow-up mechanism operates to vertically move the corresponding cover portion to follow the liquid surface.

3. The cleaning apparatus according to claim 2, wherein the cleaning apparatus further comprises a control mechanism configured to control an operation of the first and second support structures, and the control mechanism control the follow-up mechanism in accordance with a detected liquid level of the liquid surface, or an injection amount of the process liquid monitored or prescribed in a recipe.

4. The cleaning apparatus according to claim 1, wherein the follow-up mechanism allows the corresponding cover portion to follow the liquid surface.

5. The cleaning apparatus according to claim 1, wherein
    the process liquid supply mechanism is configured to selectively supply a plurality of process liquids to the cleaning tank;
    the cleaning apparatus further comprises a process liquid discharge mechanism configured to discharge the process liquid from the cleaning tank, and a control mechanism configured to control supply and discharge of the process liquid and opening and closing of the cover; and
    the control mechanism serves to control such that the cover is closed in at least part of a period of a plurality of processes in accordance with a processing sequence of the plurality of processes that are performed continuously while using the plurality of process liquids alternately in the cleaning tank.

6. The cleaning apparatus according to claim 1, wherein the follow-up mechanism includes a slide mechanism.

7. The cleaning apparatus according to claim 1, wherein the follow-up mechanism includes a parallelogram linkage mechanism.

8. The cleaning apparatus according to claim 1, wherein each of the first and second support structures further includes a moving mechanism configured to move the corresponding cover portion between a first position for allowing the corresponding cover portion to follow the liquid surface and a second position above the liquid surface, and the moving mechanism serves to move the corresponding cover portion upward to the second position to prepare for opening the cover.

9. The cleaning apparatus according to claim 8, wherein the follow-up mechanism includes a parallelogram linkage, and the moving mechanism includes a cylinder mechanism configured to switch states of the parallelogram linkage to move the corresponding cover portion between the first and second positions.

10. A cleaning apparatus comprising:
a cleaning tank configured to store a process liquid used for cleaning a plurality of target objects;
a target object holding mechanism configured to hold the target objects in the cleaning tank; and
a process liquid supply mechanism configured to supply the process liquid to the cleaning tank,
wherein the process liquid is supplied to the processing tank while the target objects are arranged in the cleaning tank, so the target objects are immersed in the process liquid, and the target objects are cleaned while letting the process liquid overflow form the cleaning tank,
the apparatus further comprising
a cover configured to cover, in contact therewith, a liquid surface in the cleaning tank, the cover being formed of first and second cover portions prepared separately from each other, and
first and second support structures disposed outside the cleaning tank and configured to support the first and second cover portions, respectively, such that the cover is opened by swinging the first and second cover portions outward into a state where the first and second cover portions are away from each other to allow the target objects to be loaded and unloaded relative to the cleaning tank, and the cover is closed by swinging the first and second cover portions inward into a state where the first and second cover portions engage with each other at a central portion of the cleaning tank,
wherein each of the first and second support structures includes
a follow-up mechanism configured for a corresponding cover portion of the first and second cover portions to move in a vertical direction while the corresponding cover portion follows the liquid surface in the cleaning tank and keeps in contact therewith,
a rotary mechanism connected to the corresponding cover portion through the follow-up mechanism and configured to swing the corresponding cover portion along with the follow-up mechanism, and
a moving mechanism configured to move the corresponding cover portion between a first portion for allowing the corresponding cover portion to follow the liquid surface and a second position above the liquid surface, and the moving mechanism serves to move the corresponding cover portion upward to the second position to prepare for opening the cover.

11. The cleaning apparatus according to claim 10, wherein the moving mechanism is configured to switch states of the follow-up mechanism to move the corresponding cover portion between the first and second portions.

12. The cleaning apparatus according to claim 10, wherein the follow-up mechanism includes a slide mechanism.

13. The cleaning apparatus according to claim 10, wherein the follow-up mechanism includes a parallelogram linkage mechanism.

14. The cleaning apparatus according to claim 10, wherein the follow-up mechanism operates to vertically move the corresponding cover portion to follow the liquid surface.

15. The cleaning apparatus according to claim 14, wherein the cleaning apparatus further comprises a control mechanism configured to control an operation of the first and second support structures, and the control mechanism control the follow-up mechanism in accordance with a detected liquid level of the liquid surface, or an injection amount of the process liquid monitored or prescribed in a recipe.

16. The cleaning apparatus according to claim 10, wherein the follow-up mechanism allows the corresponding cover portion to move to follow the liquid surface.

* * * * *